(12) United States Patent
McGarry et al.

(10) Patent No.: US 8,811,715 B2
(45) Date of Patent: Aug. 19, 2014

(54) WAFER IDENTIFICATION FAULT RECOVERY

(71) Applicant: Cognex Corporation, Natick, MA (US)

(72) Inventors: E. John McGarry, La Jolla, CA (US);
Robb Robles, Wilsonville, OR (US);
Steven Webster, Tigard, OR (US)

(73) Assignee: Cognex Corporation, Natick, MA (US)

( * ) Notice: Subject to any disclaimer, the term of this patent is extended or adjusted under 35 U.S.C. 154(b) by 86 days.

(21) Appl. No.: 13/644,151

(22) Filed: Oct. 3, 2012

(65) Prior Publication Data

US 2014/0093157 A1    Apr. 3, 2014

(51) Int. Cl.
*G06K 9/00*    (2006.01)

(52) U.S. Cl.
USPC .................. 382/149; 348/125; 356/237.3

(58) Field of Classification Search
USPC ............. 382/149; 348/125, 126; 356/239.6, 356/237.3–237.5
See application file for complete search history.

(56) References Cited

U.S. PATENT DOCUMENTS

| | | | | | |
|---|---|---|---|---|---|
| 4,847,183 | A | * | 7/1989 | Kruger | 430/322 |
| 5,109,153 | A | * | 4/1992 | Johnsen et al. | 235/468 |
| 5,463,200 | A | * | 10/1995 | James et al. | 219/121.68 |
| 5,525,810 | A | * | 6/1996 | Jewell et al. | 250/566 |
| 6,160,905 | A | * | 12/2000 | Ahn et al. | 382/141 |
| 6,312,876 | B1 | * | 11/2001 | Huang et al. | 430/323 |
| 6,570,642 | B2 | * | 5/2003 | Huang et al. | 355/67 |
| 6,667,792 | B2 | * | 12/2003 | Park et al. | 349/158 |
| 6,941,026 | B1 | * | 9/2005 | Nadabar et al. | 382/265 |
| 2001/0048508 | A1 | * | 12/2001 | Huang et al. | 355/1 |
| 2002/0158964 | A1 | * | 10/2002 | Mori et al. | 347/241 |
| 2004/0112879 | A1 | * | 6/2004 | Mori et al. | 219/121.69 |
| 2006/0291271 | A1 | * | 12/2006 | Stark et al. | 365/151 |

* cited by examiner

*Primary Examiner* — Aaron W Carter (57) ABSTRACT

Described are computer-based methods and apparatuses, including computer program products, for wafer identification fault recovery. A digital image is received that includes a data symbol comprising a message encoded in a set of data cells. The digital image is processed to form a set of classified data cells, wherein one or more classified data cells from the set of classified data cells comprises an error. User interface data is transmitted comprising the digital image and interactive graphics, the interactive graphics including at least one data cell control. Interaction data is received from the interactive graphics that modifies a data cell location, a data cell state, or both, of at least one classified data cell from the set of classified data cells to form a modified set of classified data cells. An error free decoded message string is generated based on the modified set of classified data cells.

20 Claims, 8 Drawing Sheets

WAFER IDENTIFICATION FAULT RECOVERY

TECHNICAL FIELD

The technical field relates generally to computer-based methods and apparatuses, including computer program products, for wafer identification fault recovery, and more specifically to computer-based methods and apparatuses for recovery from faults detected by semiconductor wafer reading systems when tracking and identifying semiconductor wafers.

BACKGROUND

Semiconductor manufacturing often involves processing silicon wafers using multi-step (or stage) manufacturing processes. It is often of great importance for manufacturers to identify and/or track individual wafers as they progress along such manufacturing flows. To facilitate such identification, wafers can be laser marked with serial numbers in the form of bar codes and/or alphanumeric characters, and identified using automated reading systems.

With the recent advent of the semiconductor industry's T7 specification, wafers can be laser marked with two-dimensional (2D) barcodes and redundant character strings (that contain the same information in the 2D barcode). For example, a relatively small 2D data symbol can be laser etched directly under a much larger twelve (12) character string. The character string may physically occupy an area of the wafer that is approximately three (3) to four (4) times the height and width of the 2D data symbol. Given various factors, such as the high value of usable wafer area (and therefore the desire to mark only as little area as necessary for identification), the amount of time required to laser scribe marks, the potential for inducing residual stress in the substrate during marking, and the likely particle generation associated with a laser scribing process, the redundant alphanumeric character string is often viewed as unnecessary and/or wasteful.

Regardless, the redundant character string is often included since prior to the 2D data symbol T7 specification, most wafers were marked with alphanumeric strings alone. Additionally, the character string can be used for error recovery. Because of the reflective nature of silicon substrates and the effect of various process steps on their optical characteristics, semiconductor wafer scribes can be difficult to reliably decode using automated reading systems. Since humans, in general, are not capable of manually decoding 2D barcodes, known methods for error recovery in the identification process rely on the fact that an alphanumeric string is present on the wafer and visible to the operator. For example, should an automated reading system fail to identify a wafer within a predetermined degree of confidence, an operator can assist the automated reading process by manually keying in the characters of the identification string (e.g., using a keyboard). In order to enter the string, the operator usually must be able to personally view, recognize, and key in the character string.

Known methods of wafer read-error recovery can introduce certain inefficiencies in the performance of automated wafer reading systems, which can in turn affect the semiconductor wafer manufacturing process itself. Such inefficiencies can be further compounded by the fact that operators often depend on an image of the character string formed by automated reading equipment (e.g., since it may be difficult or impossible for an operator to view the character string using the unaided human eye). Since the alphanumeric identification string can be several times larger than the optimal field of view required for reading the data symbol alone, the automated reading equipment is often unable to form an image of the alphanumeric identification string in its entirety. While automated wafer reading devices can be optimized to view alphanumeric strings, such modification often comes at the expense of reducing the resolution necessary to read the associated 2D barcode symbols. It is often the 2D barcode symbol, and not the alphanumeric string, that possesses greater potential for error correction and detection (e.g., which can lead to fewer automatic identification faults that require manual intervention).

SUMMARY OF THE INVENTION

The computerized methods and apparatus disclosed herein provide for assisted wafer identification fault recovery that does not require, for example, the manual transcription of an alphanumeric identification string. Further, the methods and apparatus disclosed herein are less susceptible to the introduction of human error.

A brief summary of various exemplary embodiments is presented. Some simplifications and omissions may be made in the following summary, which is intended to highlight and introduce some aspects of the various exemplary embodiments, but not limit the scope of the invention. Detailed descriptions of a preferred exemplary embodiment adequate to allow those of ordinary skill in the art to make and use the inventive concepts will follow in the later sections.

In one aspect, a system for decoding a data symbol marked on an object is featured. The system includes a wafer identification fault server configured to receive a digital image, the digital image comprising an image of a data symbol marked on an object, the data symbol comprising a message encoded in a set of data cells arranged in a regular pattern, each data cell comprising one bit of information encoded using a recognizable mark at a location of the data cell. The system is configured to process the digital image to form a set of classified data cells, wherein one or more classified data cells from the set of classified data cells comprises an error, each classified data cell being associated with a data cell from the set of data cells, and including a data cell location of the associated data cell in the digital image, and a data cell state indicating a presence of a recognizable mark of the associated data cell in the digital image. The processor and memory are configured to transmit user interface data comprising the digital image and interactive graphics, the interactive graphics including at least one data cell control, each data cell control being associated with a classified data cell in the set of classified data cells. The processor and memory are configured to receive interaction data from the interactive graphics that modifies a data cell location, a data cell state, or both, of at least one classified data cell from the set of classified data cells to form a modified set of classified data cells. The processor and memory are configured to generate an error free decoded message string based on the modified set of classified data cells.

In one aspect, a computerized method for data symbol recognition is featured. The method includes receiving, by a wafer identification fault server, a digital image, the digital image comprising an image of a data symbol marked on an object, the data symbol comprising a message encoded in a set of data cells arranged in a regular pattern, each data cell comprising one bit of information encoded using a recognizable mark at a location of the data cell. The method includes processing, by the wafer identification fault server, the digital image to form a set of classified data cells, wherein one or more classified data cells from the set of classified data cells comprises an error, each classified data cell being associated with a data cell from the set of data cells, and including a data cell location of the associated data cell in the digital image, and a data cell state indicating a presence of a recognizable mark of the associated data cell in the digital image. The method includes transmitting, by the wafer identification fault server, user interface data comprising the digital image overlaid with interactive graphics, the interactive graphics including at least one data cell control, each data cell control being associated with a classified data cell in the set of classified data cells. The method includes receiving, by the wafer identification fault server, interaction data from the interactive graphics that modifies a data cell location, a data cell state, or both, of at least one classified data cell from the set of classified data cells to form a modified set of classified data cells. The method includes generating, by the wafer identification fault server, an error free decoded message string based on the modified set of classified data cells.

In another aspect, a computer program product, tangibly embodied in a non-transitory computer readable medium, is featured. The computer program product includes instructions being configured to cause a data processing apparatus to receive a digital image, the digital image comprising an image of a data symbol marked on an object, the data symbol comprising a message encoded in a set of data cells arranged in a regular pattern, each data cell comprising one bit of information encoded using a recognizable mark at a location of the data cell. The computer program product includes instructions being configured to cause a data processing apparatus to process the digital image to form a set of classified data cells, wherein one or more classified data cells from the set of classified data cells comprises an error, each classified data cell being associated with a data cell from the set of data cells, and including a data cell location of the associated data cell in the digital image, and a data cell state indicating a presence of a recognizable mark of the associated data cell in the digital image. The computer program product includes instructions being configured to cause a data processing apparatus to transmit user interface data comprising the digital image overlaid with interactive graphics, the interactive graphics including at least one data cell control, each data cell control being associated with a classified data cell in the set of classified data cells. The computer program product includes instructions being configured to cause a data processing apparatus to receive interaction data from the interactive graphics that modifies a data cell location, a data cell state, or both, of at least one classified data cell from the set of classified data cells to form a modified set of classified data cells. The computer program product includes instructions being configured to cause a data processing apparatus to generate an error free decoded message string based on the modified set of classified data cells.

The techniques, which include both methods and apparatuses, described herein can provide one or more of the following advantages. Wafer identification systems can automatically detect and correct faults in machine vision processes that are used to decode data symbols on objects. Upon detection of a fault, the wafer identification system can generate interactive graphics for the system's current (erroneous) data symbol classification, and superimpose the interactive graphics on object images. The interactive graphics can be manipulated to quickly and accurately correct the errors in the system's classification (e.g., using mouse clicks, rather than methods that are susceptible to human transcription errors, such as keying in a character string).

Other aspects and advantages of the present invention will become apparent from the following detailed description, taken in conjunction with the accompanying drawings, illustrating the principles of the invention by way of example only.

BRIEF DESCRIPTION OF THE DRAWINGS

The foregoing and other aspects, features, and advantages of the present invention, as well as the invention itself, will be more fully understood from the following description of various embodiments, when read together with the accompanying drawings.

DETAILED DESCRIPTION

In general, computerized systems and methods are provided for recovering from faults during wafer identification processes. Wafer identification systems are configured to automatically capture images of data symbols on objects, and to detect and decode the data symbols using machine vision techniques. Upon identification of a fault during such a detection process, the wafer identification system generates interactive graphics that can be displayed on (or overlaid on) the captured images. The wafer identification system can receive interaction data from the interactive graphics that correct the fault, and then use the corrected data to decode the message encoded in the data symbol.

For example, in some embodiments, a SEMI-T7 2D barcode reading system (e.g., for reading 2D barcodes on semiconductor wafers) is provided that includes a 2D barcode reading intelligent camera, a wafer identification fault ("IDF") server, and a client user-interface (e.g., where the distributed components communicate over a computer network). On identification of a fault, the intelligent camera transmits image information (and/or the erroneous 2D barcode classification information) to the IDF server. The IDF server processes the image information (and/or the erroneous 2D barcode classification information) to attempt to automatically classify the 2D barcode. If successful, the IDF server clears the fault. If the IDF server fails to automatically classify the 2D barcode, the IDF server generates a graphical user-interface that displays the image information and interactive graphics (e.g., controls) configured to receive data (e.g., from an operator) to assist the IDF server in decoding the 2D barcode. Although the specification and/or figures generally describe the techniques in terms of 2D barcodes, these techniques work equally as well for decoding other types of data symbols.

Figure 1:
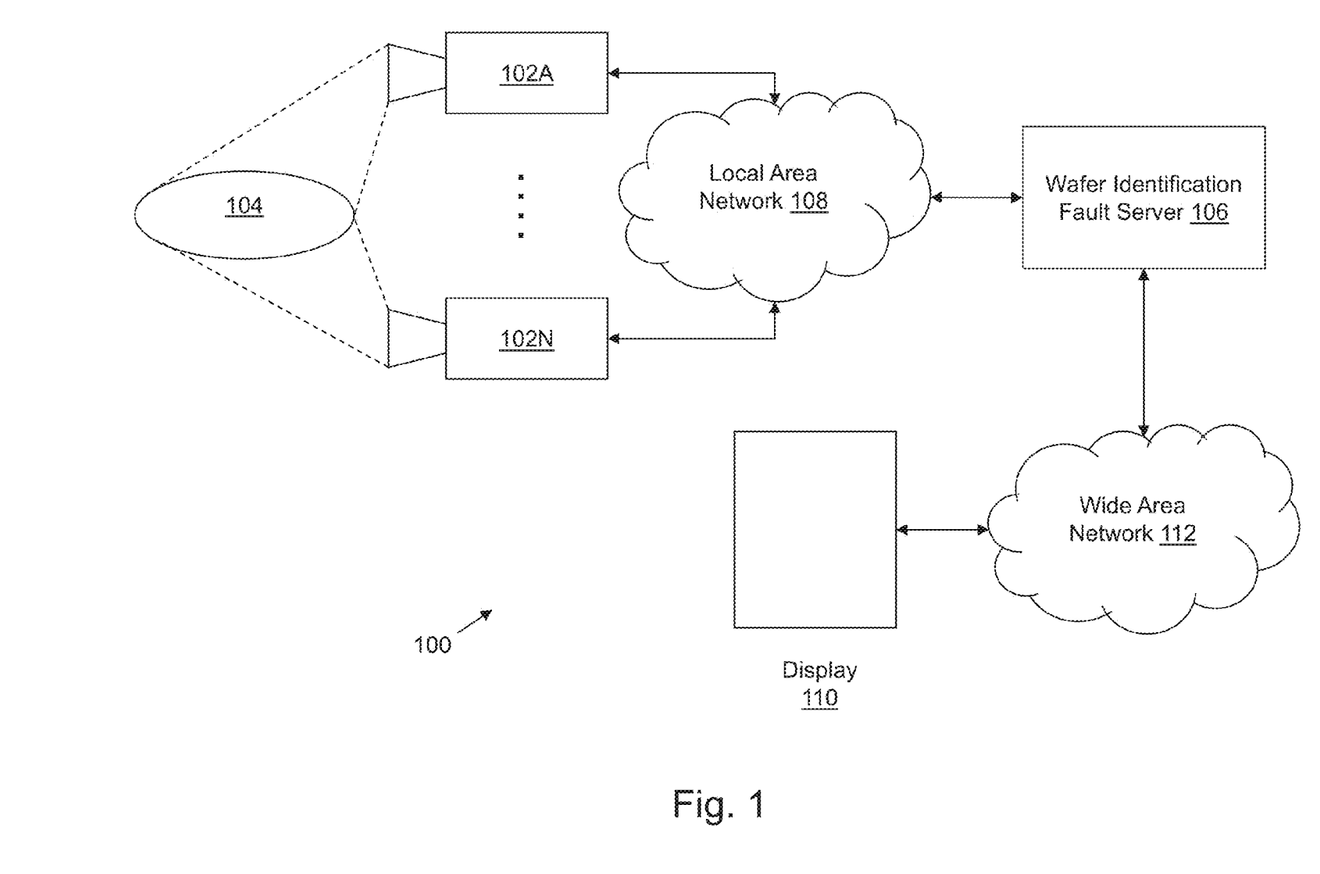
FIG. 1 is an exemplary diagram of a system for wafer identification fault recovery.

FIG. 1 is an exemplary diagram of a system 100 for wafer identification fault recovery. The system 100 includes one or more image capturing devices 102A through 102N (collectively referred to herein as "image capturing device 102"). The image capturing device 102 can be, for example, a camera such as a 2D barcode reading intelligent camera. The image capturing device 102 captures one or more images of object 104 (e.g., of silicon wafers that include a 2D barcode or other data symbol). The image capturing device 102 is in communication with wafer identification fault server 106 through local area network 108. Wafer identification fault server 106 includes a processor and memory configured to perform wafer identification fault recovery, as described herein. The wafer identification fault server 106 can be, for example, a server, a personal computer, a laptop, and/or any other type of computing device. Wafer identification fault server 106 is in communication with display 110 (e.g., that is operated by one or more users) through wide area network 112. Wafer identification fault server 106 can also include a database (not shown) to store data received from the image capturing device 102 and/or the display 110.

The system 100 is an example of a computerized system that is specially configured to perform the computerized methods described herein. However, the system structure and content recited with regard to FIG. 1 are for exemplary purposes only and are not intended to limit other examples to the specific structure shown in FIG. 1. As will be apparent to one of ordinary skill in the art, many variant system structures can be architected without departing from the computerized systems and methods described herein.

In addition, information may flow between the elements, components and subsystems described herein using any technique. Such techniques include, for example, passing the information over the networks (e.g., local area network 108 and wide area network 110) using standard protocols, such as TCP/IP, passing the information between modules in memory and passing the information by writing to a file, database, or some other non-volatile storage device. In addition, pointers or other references to information may be transmitted and received in place of, or in addition to, copies of the information. Conversely, the information may be exchanged in place of, or in addition to, pointers or other references to the information. Other techniques and protocols for communicating information may be used without departing from the scope of the invention.

Figure 2:
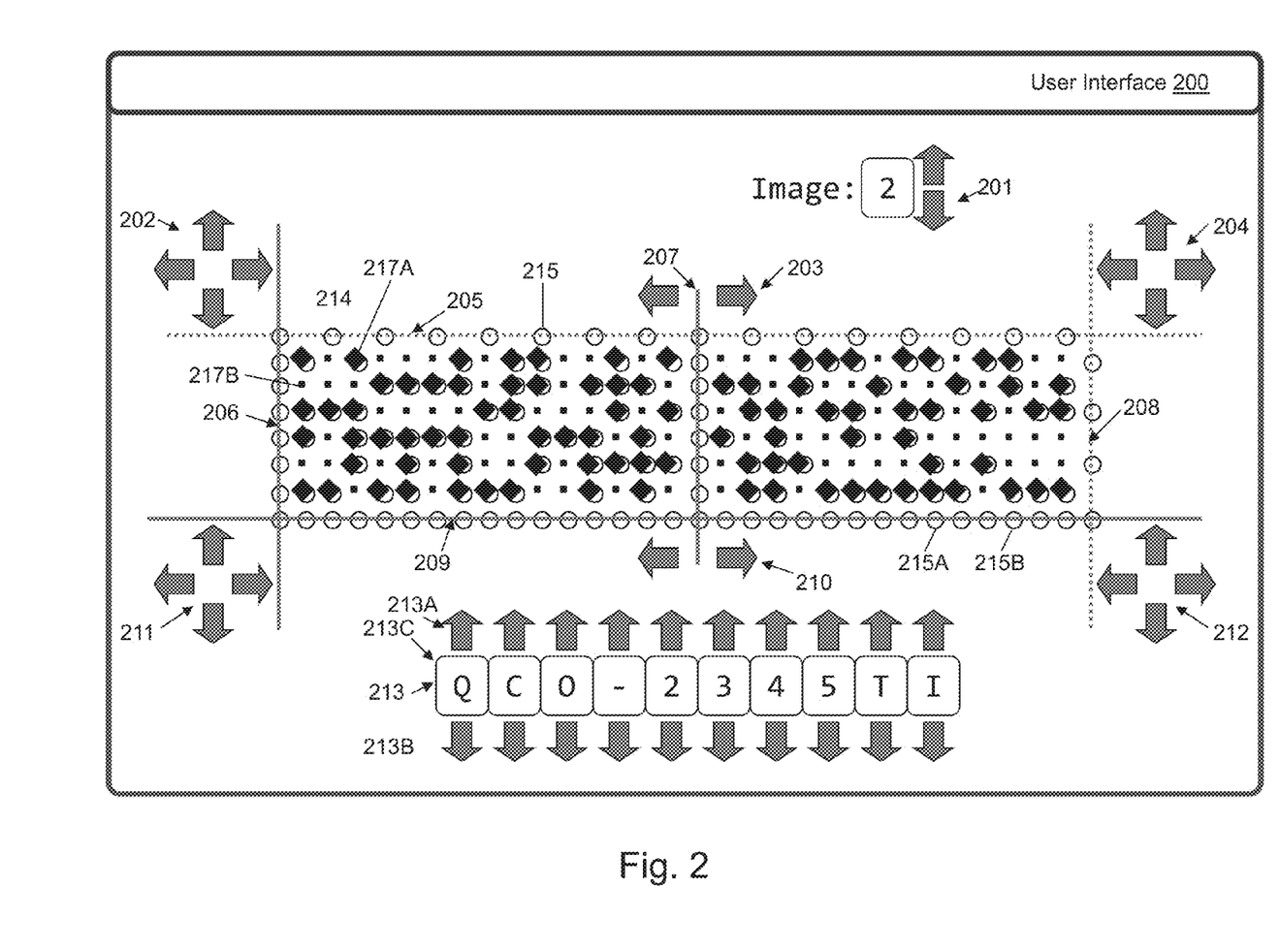
FIG. 2 is an exemplary diagram of a user-interface for wafer identification fault recovery.

FIG. 2 is an exemplary diagram of a user interface 200 for wafer identification fault recovery (e.g., displayed on display 110 of FIG. 1). User interface 200 includes image control 201, which allows selection of the current image displayed on the user interface 200 (e.g., if the image capturing device 102 captured multiple images, the image control 201 can toggle through the image set). User interface 200 includes line control 202, which allows adjustment of the intersection of line 205 and line 206. User interface 200 includes line control 203, which allows adjustment of the intersection of line 205 and line 207. User interface 200 includes line control 204, which allows adjustment of the intersection of line 205 and line 208. User interface 200 includes line control 210, which allows adjustment of the intersection of line 207 and line 209. User interface 200 includes line control 211, which allows adjustment of the intersection of line 206 and line 209. User interface 200 includes line control 212, which allows adjustment of the intersection of line 208 and line 209.

Figure 3:
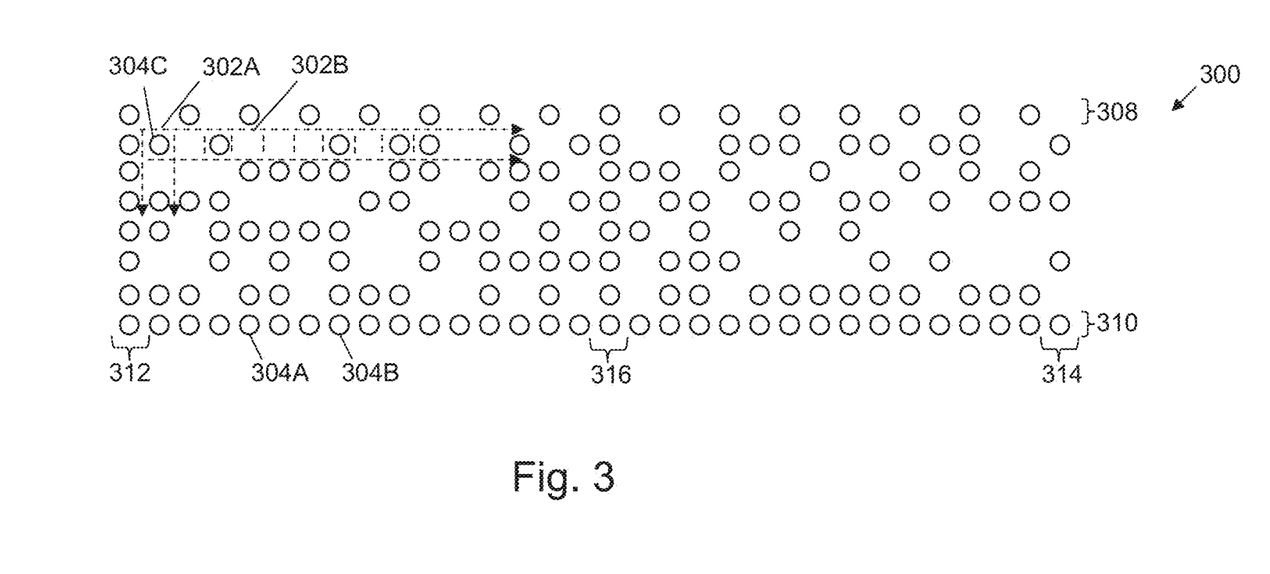
FIG. 3 is an exemplary diagram of a 2D barcode.

The user interface 200 includes a 2D barcode 215. In some embodiments, the 2D barcode 215 encodes ASCII characters (e.g., the characters displayed in alphanumeric controls 213). FIG. 3 is an exemplary diagram of a 2D barcode 300, which includes data cells that are arranged in a grid pattern: data cell 302A, data cell 302B, etc. (collectively referred to as "data cell 302"). Each data cell 302 carries one bit of data, the value of which is indicated by a marking represented by circles 304A, 304B, etc. (referred to collectively as "marking 304"). For example, data cell 302A includes a marking 304C (e.g., so data cell 302A is indicative of the binary value "1"), while data cell 302B does not include a marking (e.g., so data cell 302B is indicative of the binary value "0"). The 2D barcode 215 can be part of the image displayed in the user interface 200 (e.g., selected and/or changed using image control 201). For the exemplary 2D barcode 215, the outer-most rows (308, 310), the outermost columns (312, 314), and the center column 316 are used for alignment purposes.

Figure 4:
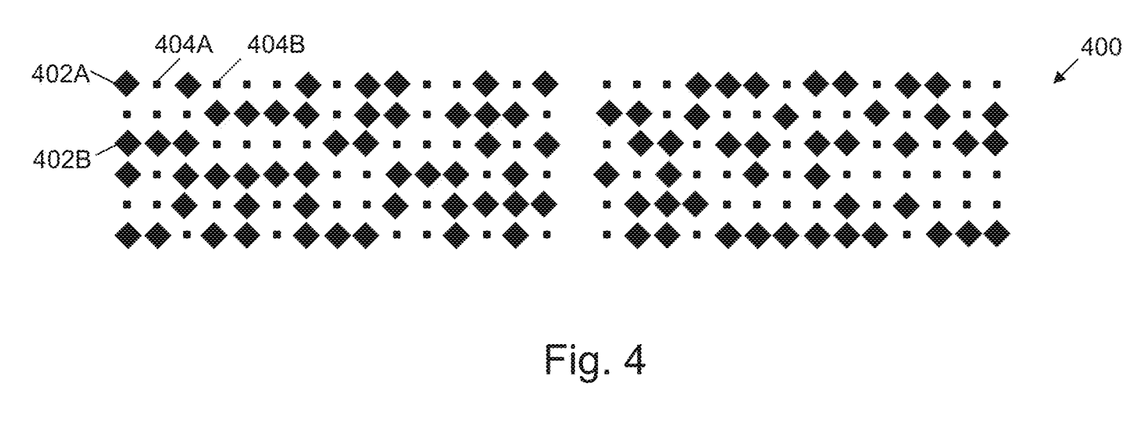
FIG. 4 is an exemplary diagram of interactive graphics for wafer identification fault recovery.

Referring to FIG. 2, the 2D barcode 215 is overlaid with interactive graphics 217A, 217B, etc. (collectively referred to as "interactive graphics 217"). FIG. 4 is an exemplary diagram of interactive graphics 400 for wafer identification fault recovery. Referring to FIGS. 3 and 4, the interactive graphics 400 indicate the binary value the wafer identification fault server 106 calculates for each data cell 302, as well as a data cell location for the data cell (e.g., coordinate information including, for example, a position of the associated data cell in the digital image displayed on the display 110). The diamond shaped classifications 402A, 402B, etc. (collectively referred to as "marking classification 402") of the interactive graphics 400 indicate that the wafer identification fault server 106 detected a marking 304 for the associated data cell 302. The square shaped classifications 404A, 404B, etc. (collectively referred to as "non-marking classification 404") indicate that the wafer identification fault server 106 did not detect a marking 304 for the associated data cell 302. For example, interactive graphics 400 includes marking classification 402A because the wafer identification fault server 106 correctly identified the marking 304C in corresponding data cell 302A. As another example, interactive graphics 400 includes non-marking classification 404B because the wafer identification fault server 106 correctly determined data cell 302B does not include a marking.

Figure 5:
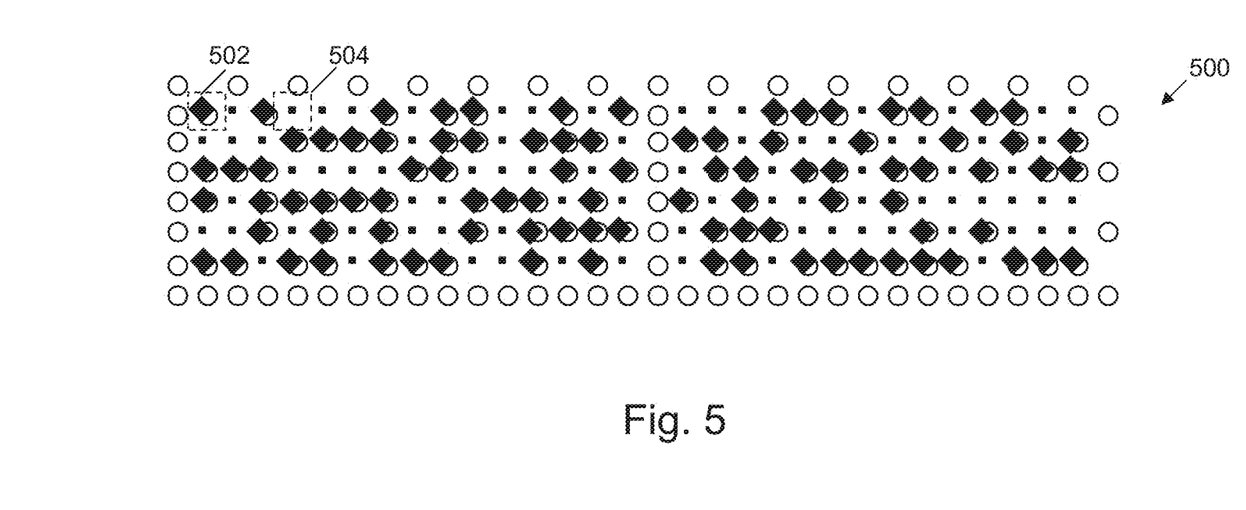
FIG. 5 is an exemplary diagram of the interactive graphics of FIG. 4 superimposed on the 2D barcode of FIG. 3 for wafer identification fault recovery.

While the wafer identification fault server 106 calculates values for the data cells 302 in the outer-most rows (308, 310), columns (312, 314), and center column 316, in some embodiments the wafer identification fault server 106 does not display interactive graphics 217 for those data cells 302 since they are used for alignment purposes (this can be seen with reference to FIG. 5, explained further below). Rather, the wafer identification fault server 106 displays lines 205, 206, 207, 208 and 209, which can be moved using associated controls 202, 203, 204, 210, 211 and 212 to adjust the alignment wafer identification fault server 106 calculated for the 2D barcode 215 (e.g., if the wafer identification fault server 106 improperly calculated the alignment areas of the 2D barcode 215). For example, if line 206 is not properly aligned with the left-most column of the 2D barcode 215, the controls 202 and 211 can be used to change the alignment of line 206 such that it is superimposed on the left-most column. For example, if the captured image of the 2D barcode 215 is distorted, the left-most column may not be substantially vertical, but may instead be skewed diagonally such that the upper portion of the column is further left than the bottom portion of the column. Control 202 can be used to move the top portion of line 206 to the left to properly align line 206 on the left-most column.

Adjusting lines 205, 206, 207, 208 and 209 can adjust the data cell locations determined by the wafer identification fault server 106. For example, if the lines are not properly aligned about the 2D barcode 215, the wafer identification fault server 106 may calculate a data cell state based on an incorrect portion of the image (e.g., which can result in an erroneous classification for a data cell). The wafer identification fault server 106 can use the adjusted lines to recalculate the data cell states. For example, the wafer identification fault server 106 can receive data that adjusts a line, and can adjust a data cell location for a set of data cells affected by the line change. For example, if line 206 is shifted to the right, the wafer identification fault server 106 can adjust the data cell locations for the data cells to compress the data cells between the resulting smaller area between lines 206 and 208.

Referring to FIG. 2, the user interface 200 displays the interactive graphics 217 and the 2D barcode 215 (e.g., superimposed on the 2D barcode 215). For example, FIG. 5 is an exemplary diagram 500 of the interactive graphics 400 of FIG. 4 superimposed on the 2D barcode 300 of FIG. 3. Each data cell 302 is overlaid with an associated interactive graphic. For example, area 502 shows data cell 302A overlaid with its associated marking classification 402A, and area 504 shows data cell 302B overlaid with its associated non-marking classification 404B. The exemplary 2D barcode 300 of FIG. 3, as explained previously, includes alignment areas 308, 310, 312, 314 and 316, and therefore the data cells 302 of those alignment areas are not overlaid with any interactive graphics. For clarity, the interactive graphics 400 in FIG. 5 are slightly skewed from the data cells 302 such that the underlying markings 304 are visible (e.g., marking classification 402A is positioned slightly off-center from data cell 302A, such that the marking 304C is visible). In some embodiments, the interactive graphics 400 are not skewed from the data cells 302.

Figure 6:
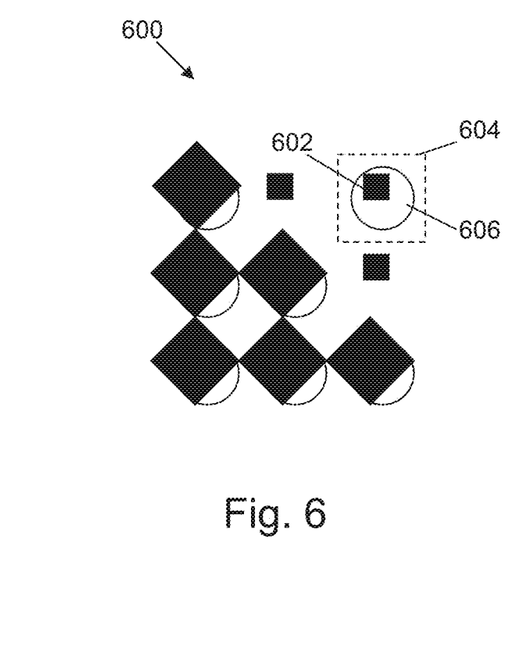
FIG. 6 is an exemplary diagram of a portion of interactive graphics overlaid on a portion of a two dimensional barcode, the interactive graphics including an erroneous classification.
Figure 7:
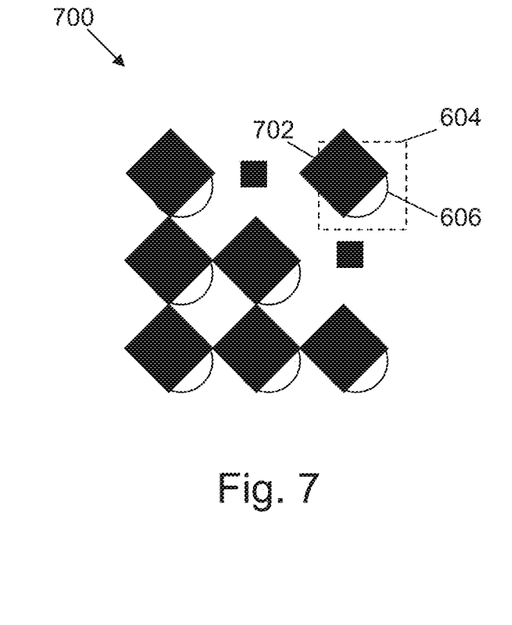
FIG. 7 is an exemplary diagram of a portion of interactive graphics overlaid on a portion of a two dimensional barcode as shown in FIG. 6, but with the erroneous classification corrected.

The individual classifications of the interactive graphics (e.g., marking classifications 402 and non-marking classifications 404) can be toggled to change one or more data cell 302 classifications determined by the wafer identification fault server 106. For example, an interactive graphic may be toggled from a marking classification 402 to a non-marking classification 404 if the wafer identification fault server 106 incorrectly classified a data cell 302 as including a marking 304 when the data cell 302 does not include a marking 304. An interactive graphic may also be toggled from a non-marking classification 404 to a marking classification 402. For example, FIG. 6 is an exemplary diagram 600 of a portion of interactive graphics overlaid on a portion of a two dimensional barcode, the interactive graphics including an erroneous non-marking classification 602 for data cell 604, which includes marking 606. The erroneous non-marking classification 602 can be toggled to correct the classification (e.g., by pointing and clicking with the mouse, using keyboard commands, using a touch screen, etc.). For example, FIG. 7 is an exemplary diagram 700 of the portion of interactive graphics overlaid on the portion of a two dimensional barcode as shown in FIG. 6, but with the erroneous non-marking classification 602 corrected to marking classification 702.

User interface 200 includes alphanumeric control 213, which displays characters of an alphanumeric string, and which allows each character to be changed using the arrows associated with the displayed character (e.g., arrows 213A and 213B can be used to increment or decrement character 213C). The wafer identification fault server 106 can generate the alphanumeric string based on data contained in the 2D barcode 215. The alphanumeric control 213 can be used to change characters of the alphanumeric string, which can in turn change and/or update one or more calculated data cell states of the interactive graphics 217 associated with the alphanumeric character. For example, the wafer identification fault server 106 may decode certain data cells, which in turn translate to the character "Q." However, if during the decode process the wafer identification fault server 106 improperly classified one or more data cells, then the character "Q" is incorrect. If the user interface 200 changes the "Q" to a different character, then the classifications of the data cells in the interactive graphics 217 that are associated with the character can be updated to reflect the new character.

Figure 8:
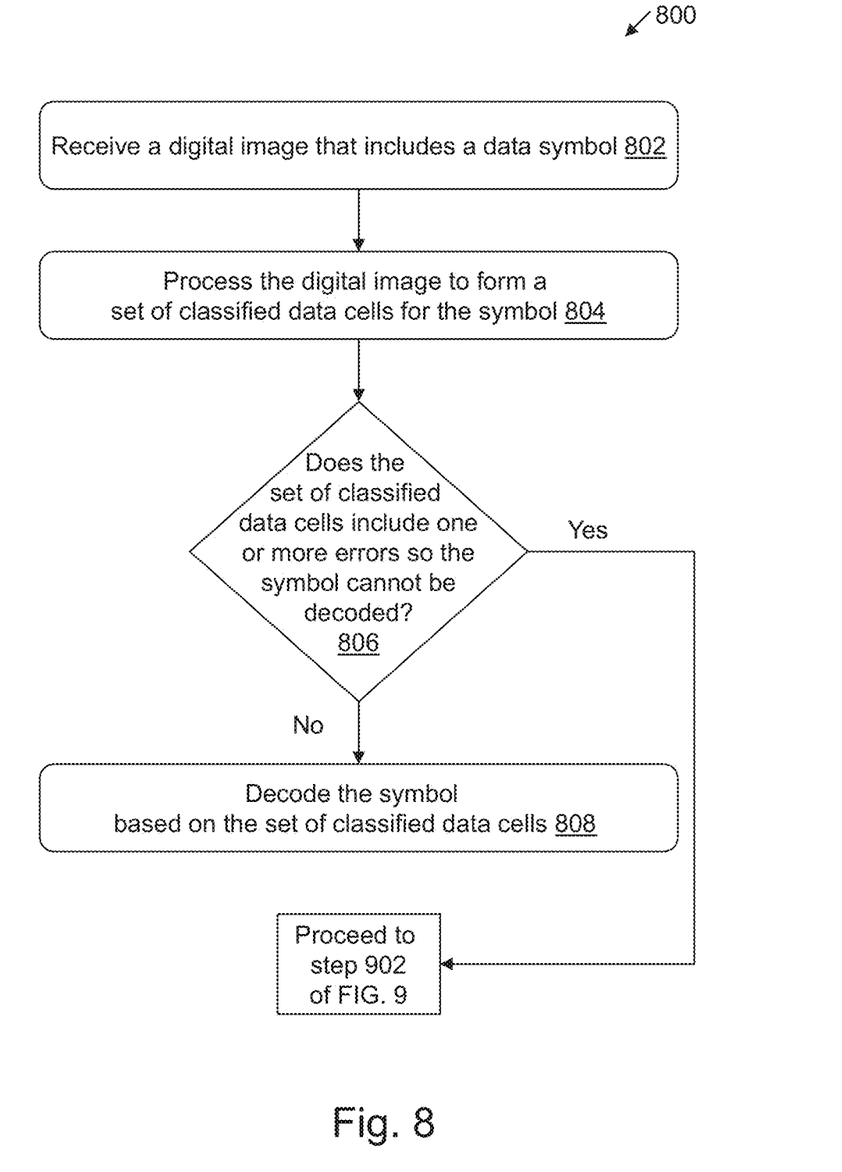
FIG. 8 is an exemplary flow chart of a computerized method for wafer identification fault recovery.

FIG. 8 is an exemplary flow chart of a computerized method 800 for wafer identification fault recovery. Method 800 can be used, for example, to decode a data symbol marked on an object. Referring to FIG. 1, at step 802 the wafer identification fault server 106 receives a digital image from image capturing devices 102. The digital image can include an image of a data symbol marked on an object that is to be decoded (e.g., e.g., a 2D barcode and associated character string), which includes a number of data cells that represent information in the data symbol. At step 804, the wafer identification fault server 106 processes the digital image to form a set of classified data cells (e.g., to automatically decode the data in the data symbol). At step 806, the wafer identification fault server 106 determines whether the set of classified data cells has any errors (e.g., misclassified data cells, such as cells classified as an unmarked data cell when it is a marked data cell). If the classified data cells do not have any errors, method 800 proceeds to step 808 and decodes the data symbol based on the classified data cells (e.g., for a 2D barcode, the wafer identification fault server 106 generates an error free decoded message string).

Figure 9:
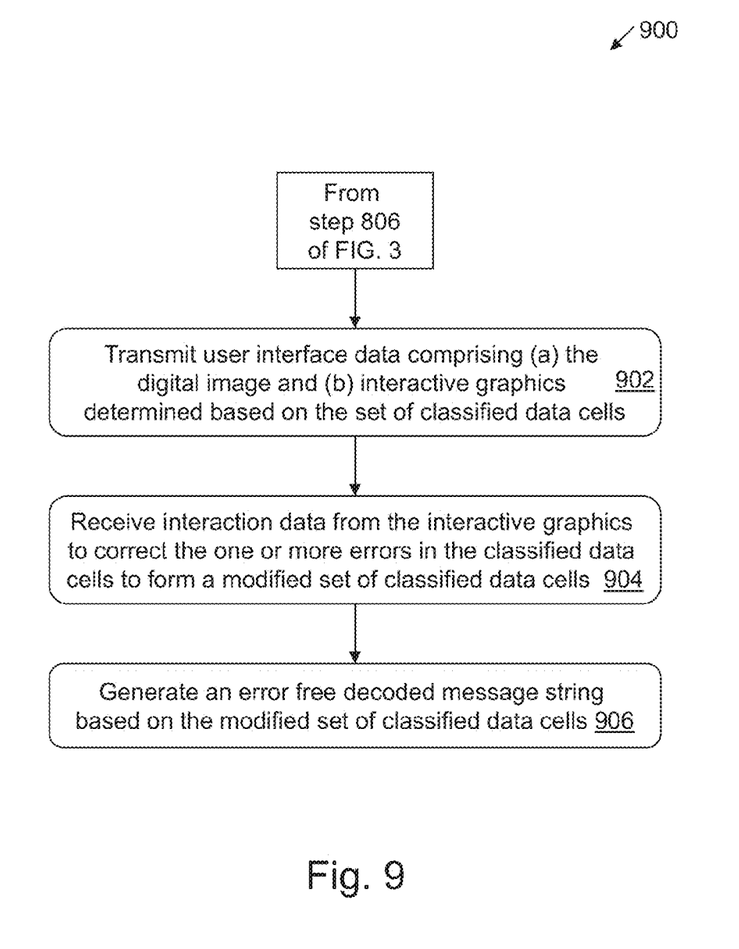
FIG. 9 is an exemplary flow chart of a computerized method for wafer identification fault recovery.

If the classified data cells include one or more errors, method 800 proceeds to step 902 of FIG. 9. At step 902, the wafer identification fault server 106 transmits user interface data to display 110 that includes (a) the digital image and (b) interactive graphics determined based on the set of classified data cells. The interactive graphics represent the classified data cells determined by the wafer identification fault server 106, and are configured to receive changes to correct the errors in the classified data cells. At step 904, the wafer identification fault server 106 receives interaction data from the interactive graphics that corrects the one or more errors in the classified data cells to form a modified set of classified data cells. At step 906, the wafer identification fault server 106 decodes the data symbol based on the modified set of classified data cells (e.g., for a 2D barcode, the wafer identification fault server 106 generates an error free decoded message string).

Referring to step 802, the object can be, for example, a silicon wafer. The data symbol can be generated by laser etching recognizable marks on the surface of the wafer. For example, a T7 barcode can be laser etched onto a silicon wafer to facilitate identification of the wafer during manufacturing. The data symbol can include a set of data cells (e.g., data cells 302 of FIG. 3) arranged in a regular pattern, each data cell comprising an image region encoding one bit of information through a recognizable mark (e.g., through the presence or absence of the mark in the data cell). The regular pattern can be a grid structure, with markings (e.g., dots, squares, etc.) on vertexes of the grid structure. For example, referring to FIG. 3, the 2D barcode 300 is arranged with data cells 302 in rows and columns.

Referring further to step 802, the wafer identification fault server 106 may receive the digital image from the image capturing devices 102 if the image capturing devices 102 fail to automatically decode the data symbol on the object. For example, the image capturing devices 102 can transmit the digital image to the wafer identification fault server 106 to decode the data symbol based on additional data that the wafer identification fault server 106 determines for the data symbol. For example, the wafer identification fault server 106 can determine additional data using the automatic decoding process performed by wafer identification fault server 106 (e.g., which can automatically decode data symbols and/or associated character(s) of a character string), and/or with additional data generated based on a user's interaction with the display 110).

Referring further to step 802, the wafer identification fault server can receive a set of different digital images of the object. For example, multiple digital images can be generated using different lighting and/or exposure settings. A user operating the display 110 can change which image is displayed using image control 201. For example, the user can change the selected image using the image control 201. The wafer identification fault server 106 receives selection data requesting display of a different image from the set of digital images for display 110. The wafer identification fault server 106 can transmit new user interface data to the display 110 to update the user interface to display the selected image.

In response to a request to display a different digital image, the wafer identification fault server 106 may regenerate the interactive graphics based on the selected image. For example, the wafer identification fault server 106 may be able to better decode the data symbol using a different image (e.g., if the different image is clearer than the original image). In some examples, the wafer identification fault server 106 may not regenerate the interactive graphics based on the selected image. For example, it may be desirable to a user to view the same interactive graphics but with different images (e.g., if the left side of the first image is clear but the right side is blurry, and the right side of the second image is clear but the left side is blurry). The user interface 200 can include an additional control (not shown) that allows configuration of whether the wafer identification fault server 106 regenerates the interactive graphics.

The wafer identification fault server 106 can generate a composite digital image based on the set of digital images received from the image capturing devices 102. For example, the wafer identification fault server can average the set of digital images to create the composite image. In some examples, a composite interactive graphical representation of the 2D symbol can be generated using the data cells extracted from the 2D symbol as it appears in multiple images (i.e. the images themselves are not merged into a single composite image). Only the data cells that can be resolved to a high degree of certainty are included in the composite representation of the 2D symbol. Therefore, the composite interactive representation of the 2D symbol will most accurately match the pattern of the actual 2D symbol as it is scribed on to the wafer, and fewer data cells will need adjustment by the user.

Referring to step 804, the wafer identification fault server 106 can generate each classified data cell based on an associated data cell from the data symbol. The classified data cell can include a data cell location that can be used to determine a position of the associated data cell in the digital image (e.g., an X, Y coordinate in the image). The classified data call can include a data cell state that indicates whether the wafer identification fault server 106 detected a mark for the associated data cell.

Referring to step 806, the wafer identification fault server 106 determines whether the set of classified data cells has any errors such that the symbol cannot be decoded. For example, the wafer identification fault server 106 can determine that the set of classified data cells does not match a message string associated with the classified data cells. As another example, the wafer identification fault server 106 may not be able to decode the set of classified data cells (e.g., because the set of classified data cells contain too many errors and therefore are undecipherable). In some examples, a 2D symbol can be decoded even when one or more errors are present (e.g., when the errors are minor enough so the decoding process can execute successfully). As an example, 2D data symbols contain built-in error correction through data redundancy. The data content in the symbol is encoded multiple times, in different code words within the symbol. This redundancy can allow a 2D symbol to be decoded even if one or more data cells of the 2D symbol are damaged, obscured, etc. But the degree to which a 2D symbol can be damaged and still be decoded successfully is a function of how many data cells are damaged and where those damaged cells are located in the symbol. For example, some symbols containing a large number of damaged cells can still be decoded if the damaged cells are concentrated in only a few code words. On the other hand, a different symbol containing the same number of damaged cells may not be decoded if those damaged cells are distributed among code words throughout the 2D symbol.

Referring to step 902, the digital image displayed (e.g., on the display) can be the actual digital image. In some examples, the displayed image is a grayscale representation of the digital image. The interactive graphics can include data cell controls (e.g., one or more controls) that are generated based on the classified data cells. For example, the wafer identification fault server can generate a data cell control for each classified data cell. The data cell control can include display information (e.g., metadata) that can be used to determine where to display the data cell control in the user interface 200. The display information can be determined based on the data cell location of the associated classified data cell. The data cell control information can also include graphical display data that the wafer identification fault server 106 determined based on the data cell state of the associated classified data cell. For example, referring to FIG. 4, each data cell control (e.g., represented by marking classifications 402 and non-marking classifications 404) is displayed at a particular location determined based on the display information (e.g., in relation to where the associated data cell is displayed on the user interface 200). Similarly, each data cell control includes a particular shape indicative of whether the wafer identification fault server 106 detected a marking for the data cell or not (e.g., marking classification 402A indicates the wafer identification fault server 106 detected a marking at data cell 302A).

In some embodiments, the wafer identification fault server 106 can generate display information for each data cell control by calculating a position for each data cell control by rotating, scaling, translating, and/or the like, the data cell location of the associated classified data cell. For example, the wafer identification fault server 106 can generate the display information to display each data cell control at an offset from the associated data cells. In some examples, the wafer identification fault server 106 can generate the display information to display each data cell control such that it is directly superimposed on the associated data cell (e.g., and therefore the data cell control completely masks the display of the associated data cell).

Referring further to step 902, the wafer identification fault server 106 can generate a decoded message string based on the set of classified data cells. If the set of classified data cells contains errors, the message string may also contain errors (e.g., incorrectly decoded characters). The wafer identification fault server 106 can transmit display data (e.g., to the display 110) that includes the alphanumeric control 213 (e.g., a character control) comprising the character(s) of the decoded message string. In some examples, as the wafer identification fault server 106 receives interaction data changing one or more classified data cells, the wafer identification fault server 106 can update the character string to reflect the changes made to the classified data cells (e.g., if the data cells associated with a character in the character string are modified to reflect a different character).

Referring to step 904, the data cell controls of the interaction data can be adjusted (e.g., based on input data from a user operating the display 110). Each change or adjustment can cause the wafer identification fault server 106 to reevaluate the data symbol based on the additional information. For example, a user can adjust a classification if the wafer identification fault server 106 improperly classified a data cell. The interaction data can modify a data cell location (e.g., image coordinates), a data cell state (e.g., the binary classification of whether the data cell includes a mark), or both, of a classified data cell. For example, the interaction data can change a binary classification of a classified data cell from false to true (or from true to false) to indicate that the system incorrectly classified an associated data cell of the data symbol. For example, referring to FIGS. 6 and 7, a user can see that non-marking classification 602 is incorrect because the data cell 604 includes marking 606. The user can change non-marking classification 602 by clicking on the data cell control to change it from non-marking classification 602 to marking classification 702. The wafer identification fault server 106 can receive interaction data indicative of these changes and generate a modified set of classified data cells. Once all errors are corrected, the modified set of classified data cells can include both the original classified data cells, as well as the changes made to the original classified data cells, which achieves an error-free classification of the data symbol.

Referring further to step 904, the wafer identification fault server 106 can receive interaction data from the character control 213 to change a displayed character to a different character. The wafer identification fault server 106 can modify binary classification(s) of the classified data cells (e.g., those associated with the character) based on the interaction data to reflect the different character in the interactive graphics as well. For example, since the character string could be initially generated based on an incorrect set of classified data cells, the character string may also be incorrect. The wafer identification fault server 106 can be configured to effectuate changes made to the character string to the classified data cells (and vice versa). In some embodiments, the wafer identification fault server 106 can be configured to highlight which data cells are associated with a particular character in the character string. For example, the wafer identification fault server can receive interaction data from the character control 213 to identify the data cell controls (or data cells) that are associated with the character. The wafer identification fault server 106 can transmit display data to the display 110 that includes graphical identification data for the data cell controls associated with the character (e.g., which highlights the data cells and the associated data cell controls, adds additional graphics (such as outlines), and/or the like).

Referring to step 906, the wafer identification fault server 106 can generate an error free decoded message string based on the modified set of classified data cells (e.g., as modified based on user input to correct improperly classified data cells). For example, the wafer identification fault server 106 can generate an error free data string based on the modified set of classified data cells. The error free data string includes a set of one or more characters and a checksum for each character. The wafer identification fault server 106 can generate the error free decoded message string based on the error free data string.

The above-described techniques can be implemented in digital electronic circuitry, or in computer hardware, firmware, software, or in combinations of them. The implementation can be as a computer program product, i.e., a computer program tangibly embodied in a machine-readable storage device, for execution by, or to control the operation of, a data processing apparatus, e.g., a programmable processor, a computer, and/or multiple computers. A computer program can be written in any form of computer or programming language, including source code, compiled code, interpreted code and/or machine code, and the computer program can be deployed in any form, including as a stand-alone program or as a subroutine, element, or other unit suitable for use in a computing environment. A computer program can be deployed to be executed on one computer or on multiple computers at one or more sites.

Method steps can be performed by one or more processors executing a computer program to perform functions of the invention by operating on input data and/or generating output data. Method steps can also be performed by, and an apparatus can be implemented as, special purpose logic circuitry, e.g., a FPGA (field programmable gate array), a CPLD (complex programmable logic device), a PSoC (Programmable System-on-Chip), ASIP (application-specific instruction-set processor), or an ASIC (application-specific integrated circuit). Subroutines can refer to portions of the computer program and/or the processor/special circuitry that implement one or more functions.

Processors suitable for the execution of a computer program include, by way of example, both general and special purpose microprocessors, digital signal processors, and any one or more processors of any kind of digital computer. Generally, a processor receives instructions and data from a read-only memory or a random access memory or both. The essential elements of a computer are a processor for executing instructions and one or more memory devices for storing instructions and/or data. Memory devices, such as a cache, can be used to temporarily store data. Memory devices can also be used for long-term data storage. A computer can be operatively coupled to external equipment, for example factory automation or logistics equipment, or to a communications network, for example a factory automation or logistics network, in order to receive instructions and/or data from the equipment or network and/or to transfer instructions and/or data to the equipment or network. Computer-readable storage devices suitable for embodying computer program instructions and data include all forms of volatile and non-volatile memory, including by way of example semiconductor memory devices, e.g., DRAM, SRAM, EPROM, EEPROM, and flash memory devices; magnetic disks, e.g., internal hard disks or removable disks; magneto-optical disks; and optical disks, e.g., CD, DVD, HD-DVD, and Blu-ray disks. The processor and the memory can be supplemented by and/or incorporated in special purpose logic circuitry.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A system for decoding a data symbol marked on an object, the system comprising a wafer identification fault server configured to:
   receive a digital image, the digital image comprising an image of a data symbol marked on an object, the data symbol comprising a message encoded in a set of data cells arranged in a regular pattern, each data cell comprising one bit of information encoded using a recognizable mark at a location of the data cell;
   process the digital image to form a set of classified data cells, wherein one or more classified data cells from the set of classified data cells comprises an error, each classified data cell being associated with a data cell from the set of data cells, and comprising:
      a data cell location of the associated data cell in the digital image; and
      a data cell state indicating a presence of a recognizable mark of the associated data cell in the digital image;
   transmit user interface data comprising the digital image and interactive graphics, the interactive graphics including at least one data cell control, each data cell control being associated with a classified data cell in the set of classified data cells;
   receive interaction data from the interactive graphics that modifies a data cell location, a data cell state, or both, of at least one classified data cell from the set of classified data cells to form a modified set of classified data cells; and
   generate an error free decoded message string based on the modified set of classified data cells.

2. The system of claim 1, wherein the system is further configured to:
   generate an error free data string based on the modified set of classified data cells, wherein the error free data string comprises one or more characters and a checksum for each of the one or more characters; and
   generate the error free decoded message string based on the error free data string.

3. The system of claim 1, further comprising a display in communication with the computing device configured to:
   receive the user interface data and display the user interface data; and
   display the error free decoded message string.

4. The system of claim 1, wherein the computing device is further configured to:
   generate an error-containing decoded message string based on the set of classified data cells; and
   transmit second display data that includes a character control comprising a character of the error-containing decoded message string.

5. The system of claim 4, wherein the computing device is further configured to:
   receive second interaction data from the character control to change the character to a different character; and
   modify a binary classification of one or more classified data cells based on the second interaction data to reflect the different character.

6. The system of claim 4, wherein the computing device is further configured to:
   receive second interaction data from the character control to identify one or more data cell controls associated with the character; and
   transmit third display data that includes graphical identification data for the one or more cell controls associated with the character.

7. The system of claim 1, wherein the computing device is further configured to receive a set of digital images of the object, each image being captured using a predefined set of lighting and exposure settings.

8. The system of claim 7, wherein the computing device is further configured to:
   display an interactive graphical control configured to allow selection of an image from the set of digital images for display;
   receive selection data indicative of a selected image from the set of digital images for display; and
   transmit second user interface data comprising the selected image.

9. The system of claim 8, wherein the computing device is further configured to:
   generate second interactive graphics based on the selected image; and
   transmit third user interface data comprising the second interactive graphics.

10. The system of claim 7, wherein the computing device is further configured to generate a composite digital image based on the set of digital images.

11. The system of claim 1, wherein:
   the object comprising the data symbol is a silicon wafer, and recognizable marks of the data symbol are formed on a surface of the wafer by laser etching; and
   wherein the regular pattern comprises a grid structure, wherein each recognizable mark comprises a marking on a vertex of the grid structure.

12. The system of claim 1, wherein the computing device is further configured to:
   receive the digital image that has not been automatically decoded from one or more image capturing devices.

13. The system of claim 1, wherein the interaction data changes:
   a binary classification of a classified data cell from false to true or from true to false, in either case to indicate that the system incorrectly classified an associated data cell of the data symbol.

14. The system of claim 1, wherein the computing device is further configured to:
   generate display information for each data cell control based on a data cell location of the associated classified data cell, by calculating a position for each data cell control by rotating, scaling, translating, or any combination thereof, the data cell location of the associated classified data cell.

15. A computerized method for data symbol recognition, comprising:
   receiving, by a wafer identification fault server, a digital image, the digital image comprising an image of a data symbol marked on an object, the data symbol comprising a message encoded in a set of data cells arranged in a regular pattern, each data cell comprising one bit of information encoded using a recognizable mark at a location of the data cell;
   processing, by the wafer identification fault server, the digital image to form a set of classified data cells, wherein one or more classified data cells from the set of classified data cells comprises an error, each classified data cell being associated with a data cell from the set of data cells, and comprising:
      a data cell location of the associated data cell in the digital image; and a data cell state indicating a presence of a recognizable mark of the associated data cell in the digital image;

transmitting, by the wafer identification fault server, user interface data comprising the digital image overlaid with interactive graphics, the interactive graphics including at least one data cell control, each data cell control being associated with a classified data cell in the set of classified data cells;

receiving, by the wafer identification fault server, interaction data from the interactive graphics that modifies a data cell location, a data cell state, or both, of at least one classified data cell from the set of classified data cells to form a modified set of classified data cells; and generating, by the wafer identification fault server, an error free decoded message string based on the modified set of classified data cells.

16. The method of claim 15, further comprising:

generating an error free data string based on the modified set of classified data cells, wherein the error free data string comprises one or more characters and a checksum for each of the one or more characters; and generating the error free decoded message string based on the error free data string.

17. The method of claim 15, further comprising:

generating an error-containing decoded message string based on the set of classified data cells; and transmitting second display data that includes a character control comprising a character of the error-containing decoded message string.

18. The method of claim 17, further comprising:

receiving second interaction data from the character control to change the character to a different character; and modifying a binary classification of one or more classified data cells based on the second interaction data to reflect the different character.

19. The method of claim 17, further comprising:

receiving second interaction data from the character control to identify one or more data cell controls associated with the character; and transmitting third display data that includes graphical identification data for the one or more cell controls associated with the character.

20. A computer program product, tangibly embodied in a non-transitory computer readable medium, the computer program product including instructions being configured to cause a data processing apparatus to:

receive a digital image, the digital image comprising an image of a data symbol marked on an object, the data symbol comprising a message encoded in a set of data cells arranged in a regular pattern, each data cell comprising one bit of information encoded using a recognizable mark at a location of the data cell;

process the digital image to form a set of classified data cells, wherein one or more classified data cells from the set of classified data cells comprises an error, each classified data cell being associated with a data cell from the set of data cells, and comprising:

a data cell location of the associated data cell in the digital image; and a data cell state indicating a presence of a recognizable mark of the associated data cell in the digital image;

transmit user interface data comprising the digital image overlaid with interactive graphics, the interactive graphics including at least one data cell control, each data cell control being associated with a classified data cell in the set of classified data cells;

receive interaction data from the interactive graphics that modifies a data cell location, a data cell state, or both, of at least one classified data cell from the set of classified data cells to form a modified set of classified data cells; and generate an error free decoded message string based on the modified set of classified data cells.

* * * * *